(12) United States Patent
Riordon et al.

(10) Patent No.: US 8,164,068 B2
(45) Date of Patent: Apr. 24, 2012

(54) MASK HEALTH MONITOR USING A FARADAY PROBE

(75) Inventors: Benjamin B. Riordon, Newburyport, MA (US); Nicholas P. T. Bateman, Reading, MA (US); William T. Weaver, Austin, TX (US); Russell J. Low, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 91 days.

(21) Appl. No.: 12/845,665

(22) Filed: Jul. 28, 2010

(65) Prior Publication Data
US 2011/0031408 A1 Feb. 10, 2011

Related U.S. Application Data

(60) Provisional application No. 61/229,852, filed on Jul. 30, 2009.

(51) Int. Cl.
*H01J 37/317* (2006.01)
*H01J 37/244* (2006.01)
*H01J 3/07* (2006.01)

(52) U.S. Cl. .......... 250/397; 250/492.21; 250/398; 250/396 R; 250/491.1; 250/489

(58) Field of Classification Search .......... 250/397, 250/398, 396 R, 492.21, 491.1, 489
See application file for complete search history.

(56) References Cited

U.S. PATENT DOCUMENTS

| | | | |
|---|---|---|---|
| 5,180,918 A * | 1/1993 | Isobe | 250/492.2 |
| 6,528,805 B2 * | 3/2003 | Fang et al. | 250/492.21 |
| 7,394,073 B2 * | 7/2008 | Cummings et al. | 250/397 |
| 2006/0289798 A1 | 12/2006 | Cummings et al. | |
| 2008/0087844 A1 | 4/2008 | Nunan et al. | |
| 2009/0098718 A1 | 4/2009 | Knaipp et al. | |

* cited by examiner

*Primary Examiner* — Nikita Wells (57) ABSTRACT

In an ion implanter, an ion current measurement device is disposed behind a mask co-planarly with respect to a surface of a target substrate as if said target substrate was positioned on a platen. The ion current measurement device is translated across the ion beam. The current of the ion beam directed through a plurality of apertures of the mask is measured using the ion current measurement device. In this manner, the position of the mask with respect to the ion beam as well as the condition of the mask may be determined based on the ion current profile measured by the ion current measurement device.

14 Claims, 10 Drawing Sheets

MASK HEALTH MONITOR USING A FARADAY PROBE

RELATED APPLICATIONS

This patent application claims priority to U.S. Provisional Patent Application Ser. No. 61/229,852, filed Jul. 30, 2009 which is hereby incorporated by reference in its entirety.

BACKGROUND OF THE INVENTION

1. Field of the Invention

Embodiments of the invention relate to the field of device fabrication. More particularly, the present disclosure relates to ion implantation through a mask and a device and system to monitor the health of the mask used during ion implantation.

2. Discussion of Related Art

Ion implantation is a standard technique for introducing conductivity-altering impurities into substrates. A precise doping profile in a substrate and associated thin film structure is critical for proper device performance. Generally, a desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Such an ion implanter may be used to implant desired dopants into a silicon substrate to form solar cells. These solar cells provide pollution-free, equal-access energy using a recurring natural resource. Due to environmental concerns and rising energy costs, solar cells are becoming more globally important. Any reduced cost to the manufacture or increases in production of high-performance solar cells or any efficiency improvement to high-performance solar cells would have a positive impact on the implementation of solar cells worldwide. This will enable the wider availability of this clean energy technology.

Figure 1:
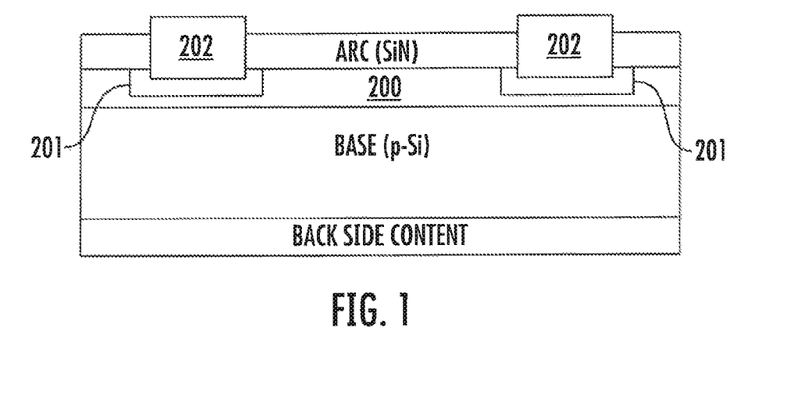
FIG. 1 is a cross-sectional view of a selective emitter solar cell.

Solar cells may require doping to improve efficiency. FIG. 1 is a cross-sectional view of a selective emitter solar cell. It may increase efficiency to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 100-300 μm across.

Figure 2:
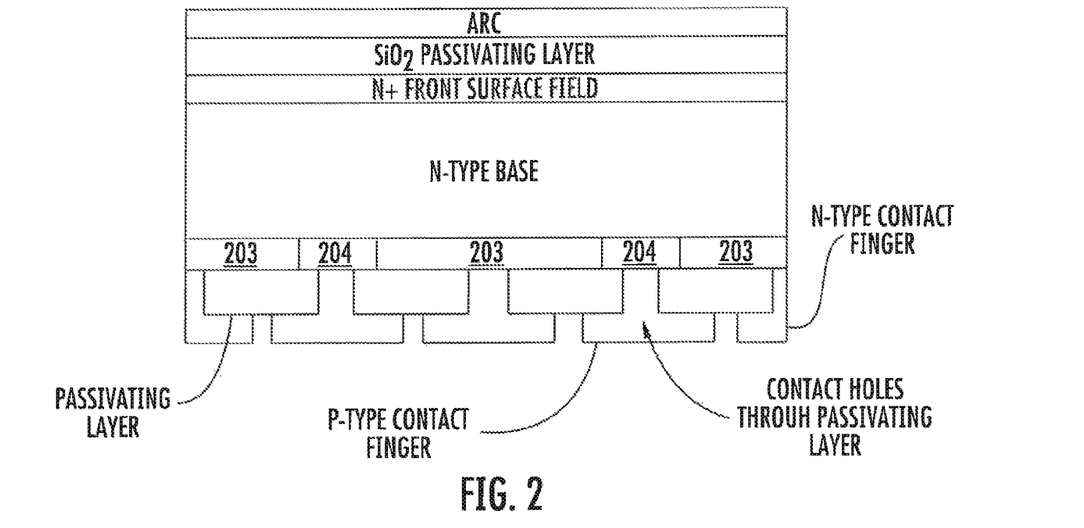
FIG. 2 is a cross-sectional view of an interdigitated back contact solar cell.

FIG. 2 is a cross-sectional view of an interdigitated back contact (IBC) solar cell. In the IBC solar cell, the junction is on the back of the solar cell. The doping pattern is alternating p-type and n-type dopant regions in this particular embodiment. The p+ emitter 203 and the n+ back surface field 204 may be doped. This doping may enable the junction in the IBC solar cell to function or have increased efficiency.

In the past, solar cells have been doped using a dopant-containing glass or a paste that is heated to diffuse dopants into the solar cell. This does not allow precise doping of the various regions of the solar cell and, if voids, air bubbles, or contaminants are present, non-uniform doping may occur. Solar cells could benefit from ion implantation because ion implantation allows precise doping of the solar cell. Ion implantation of solar cells, however, may require a certain pattern of dopants or that only certain regions of the solar cell substrate are implanted with ions. Previously, implantation of only certain regions of a substrate has been accomplished using photoresist and ion implantation. Use of photoresist, however, would add an extra cost to solar cell production because extra process steps are involved. Other hard masks on the solar cell surface likewise are expensive and require extra steps. Accordingly, there is a need in the art for an improved method of implanting through a mask and, more particularly, a health monitor for a mask used for ion implantation.

SUMMARY OF THE INVENTION

Exemplary embodiments of the present invention are directed to an apparatus and method of determining alignment of a mask in an ion implanter. In an exemplary method, an ion beam is directed through a plurality of apertures of a mask toward a platen configured to support a target substrate. An ion current measurement device is disposed behind the mask in a substantially co-planar relationship with respect to the target substrate as if the substrate is positioned on said platen. The ion current measurement device is translated across the ion beam. The position of the ion current measurement device is recorded as it translates across the ion beam. A current of the ion beam directed through the plurality of apertures of the mask is measured using the ion current measurement device at the recorded positions. A current signal is generated in response to the measured ion beam current from the ion current measurement device at each of the recorded positions. The current signal is transmitted to a controller and a control signal is generated by the controller and is used to position at least one of the ion beam or the mask based on the control signal such that a mean ion beam angle is centered with respect to a center one of the plurality of apertures of the mask.

In an exemplary embodiment, an ion implanter system includes an ion source, a beam line assembly, a mask, an ion current measurement device and a controller. The beam line assembly is configured to extract ions from the ion source to form an ion beam and direct the ion beam toward a a platen. The mask is disposed in front of the platen. The mask has a plurality of apertures to allow respective portions of the ion beam through the mask toward a said platen. The ion current measurement device is disposed substantially co-planarly with the surface of the target substrate as if the target substrate was positioned on the platen. The ion current measurement device is configured to translate across the ion beam co-planarly with respect to the surface of the target substrate. The ion current measurement device is also configured to generate signals proportional to the ion current received through the apertures as the measurement device translates across the ion beam. The controller is configured to receive the signals from the ion current measurement device and determine an orientation of the mask with respect to the target substrate such that angles of the ion beam through one or more of the plurality of apertures in the mask are aligned.

DETAILED DESCRIPTION

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3A:
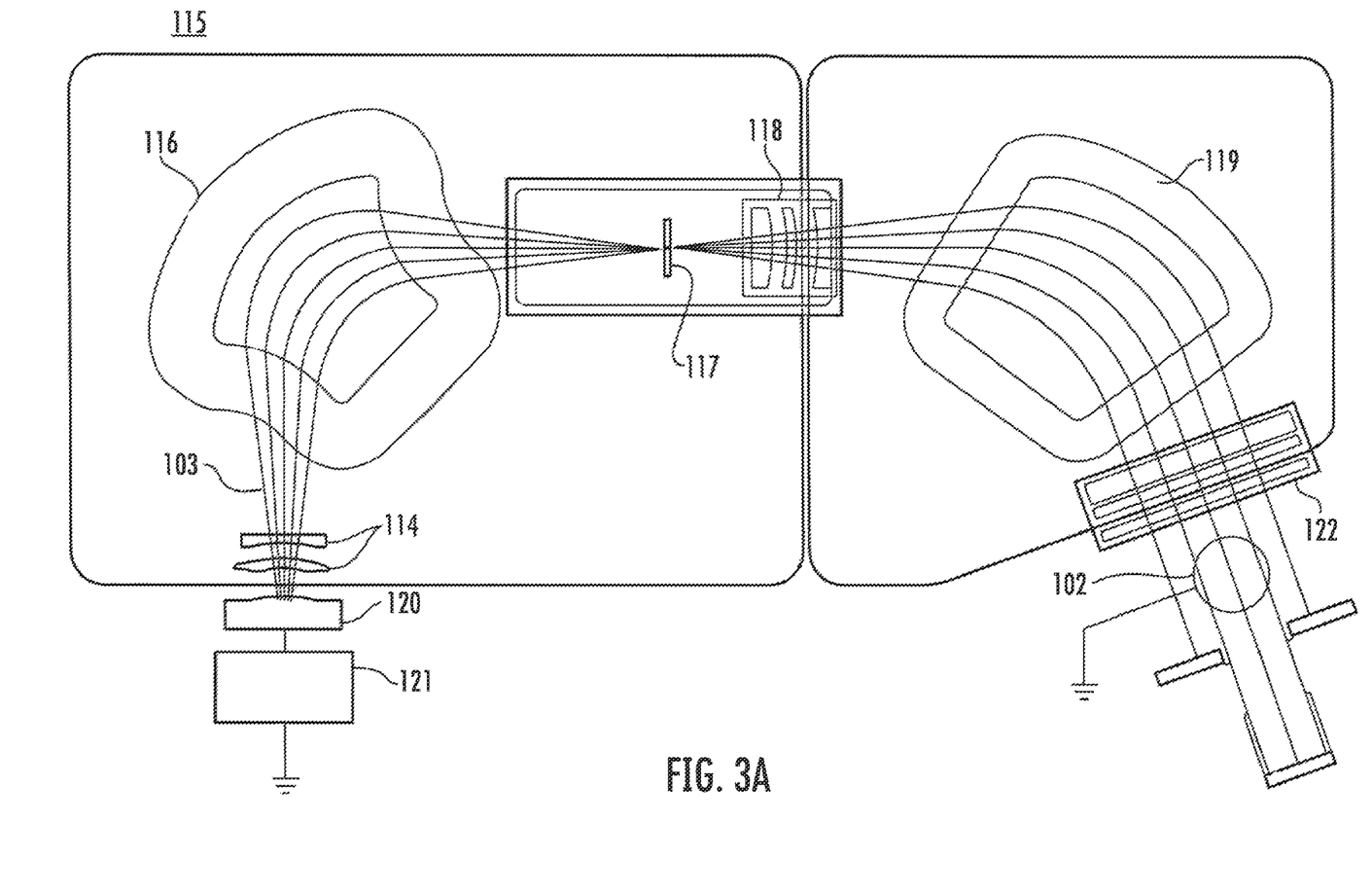
FIG. 3A is a block diagram of a representative ion implanter in accordance with an embodiment of the present disclosure.

FIG. 3A is a block diagram of an ion implanter 115 including an ion source chamber 120. A power supply 121 supplies the required energy to source chamber 120 which is configured to generate ions of a particular species. The generated ions are extracted from the source through a series of electrodes 114 and formed into a beam 103 which passes through a mass analyzer magnet 116. The mass analyzer is configured with a particular magnetic field such that only the ions with a desired mass-to-charge ratio are able to travel through the analyzer for maximum transmission through the mass resolving slit 117. Ions of the desired species pass from mass slit 117 through deceleration stage 118 to corrector magnet 119. Corrector magnet 119 is energized to deflect ion beamlets in accordance with the strength and direction of the applied magnetic field to provide a ribbon beam targeted toward a work piece or substrate positioned on support (e.g. platen) 102. In some embodiments, a second deceleration stage 122 may be disposed between corrector magnet 119 and support 102. The ions lose energy when they collide with electrons and nuclei in the substrate and come to rest at a desired depth within the substrate based on the acceleration energy. A mask 104 and ion current measurement device 106 (shown in FIG. 4) are disposed proximate a process chamber which houses platen 102.

Figure 3B:
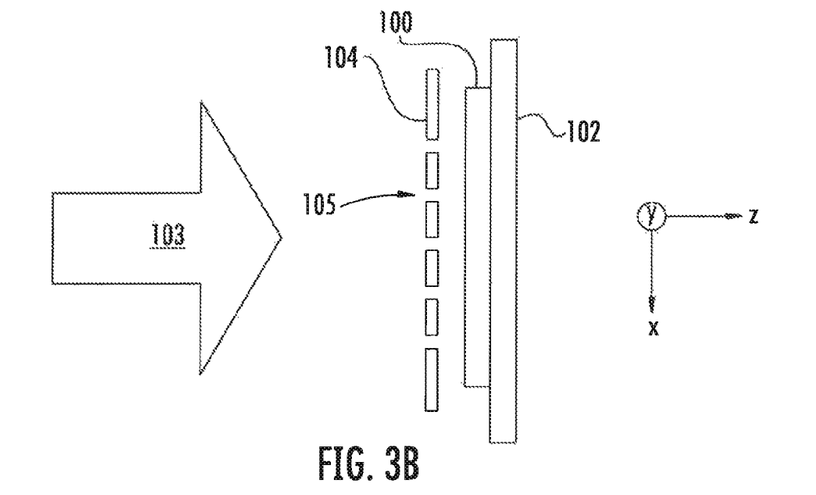
FIG. 3B is a cross-sectional view of implantation through a mask.

FIG. 3B is an exploded cross-sectional view of implantation of a substrate 100 utilizing a mask. When a specific pattern of ion implantation in a substrate 100 is desired, a mask 104 may be placed in front of substrate 100 in the path of an ion beam 103. This mask 104 may be a shadow or proximity mask. The substrate 100 may be, for example, a solar cell which is placed on platen 102, which may use electrostatic or physical force to retain the substrate 100 thereon. The mask 104 has apertures 105 that correspond to the desired pattern of ion implantation in the surface of substrate 100.

Use of the mask 104 eliminates process steps, such as silkscreening or lithography, required for other ion implantation techniques. However, it may be difficult to properly place the mask 104 relative to the substrate 100 to allow the desired pattern of ion implantation. The mask 104, the ion beam 103, and the platen 102 all have linear and angular tolerance variations that may lead to misalignment or misplacement of the mask 104.

Figure 4:
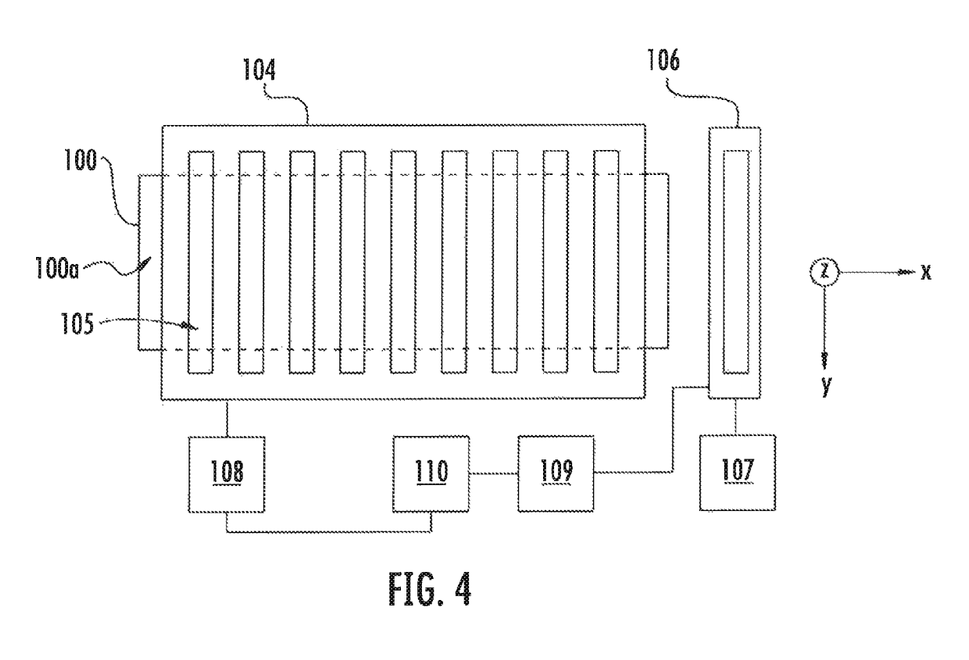
FIG. 4 is a front schematic view of implantation through a mask using a Faraday probe in accordance with an embodiment of the present disclosure.

FIG. 4 is a front schematic view of implantation assembly including a mask using a Faraday probe positioned parallel or co-planarly with substrate 100 as if the substrate was positioned on the platen 102 in the exemplary ion implanter shown in FIG. 3A. The mask 104 includes a plurality of apertures 105 and is disposed in front of the substrate 100 (partially outlined with dotted lines behind the mask 104). The apertures 105 may also be configured as holes, slots or other geometry configured to allow portions of the ion beam through the mask. The mask 104 may be translated or positioned in multiple axes using a translation mechanism 108. This translation mechanism 108 may be a servo motor used to variably position the mask linearly with respect to a distance from substrate 100 and angularly with respect to the transmission of ion beam in the z direction through the apertures. The substrate 100 may be scanned behind the mask 104 in one embodiment to obtain a uniform pattern of implanted regions. The implanted regions may resemble "stripes" across the surface of the substrate 100 in the X and Y directions. For proper operation, the mask 104 must be aligned (as described below) with substrate 100 as well as the ion beam implanted through the apertures 105. Over time, the mask 104 may erode and the apertures 105 may become incorrectly sized or have incorrect dimensions, thereby compromising a desired implant profile.

The Faraday probe 106 is disposed behind mask 104 and is configured to move in the X direction across the ion beam 103 when the substrate 100 is not positioned on platen 102. The Faraday probe is position on the same plane (i.e. the Z direction) as the surface 100a of substrate 100 as of the substrate was positioned on platen 102. The Faraday probe 106, or Faraday cup, is used to measure the current of ion beam 103 incident on the same plane as surface 100a to mimic implantation of regions of substrate 100 aligned with apertures 105 of mask 104 as if the substrate 100 was positioned on the platen 102. Alternatively, multiple Faraday cups may be included on Faraday probe 106 or multiple Faraday probes 106 may also be employed. The Faraday probe 106 is positioned behind the mask 104 and coplanar with a surface 100a of substrate 100 in place of substrate 100 to mimic implantation of the ion beam in the substrate. Faraday probe 106 is configured to move in the X direction via translation mechanism 107, which may be, for example, one or more servo motors. Faraday probe 106 is connected to a current measurement device 109. In this manner, the Faraday probe 106 receives the current of the incident ion beam 103 as if it were substrate 100 and measurement device 109 measures the current that travels from the Faraday probe 106 to ground.

This current is converted to a control signal which is supplied to controller 110.

The controller 110 reads the control signal from the current measurement device 109 and determines if position correction is necessary for the mask 104 or ion beam 103. The controller 110 can send signals to the translation mechanism 108, the translation mechanism 107, or another system or component to correct positioning of the mask or to translate the Faraday probe. In one embodiment, a separate motion control system may be used to process the new desired positioning requirements and to drive the various mechanisms, systems, and components. The controller 110 also may adjust the ion beam or substrate 100. Use of the Faraday probe 106 enables more accurate placement of the mask 104, substrate 100, and ion beam and improves implantation of the substrate 100 by optimally aligning the apertures 105 of mask 104 with the substrate 100 when the substrate is positioned on platen 102.

Figure 5A:
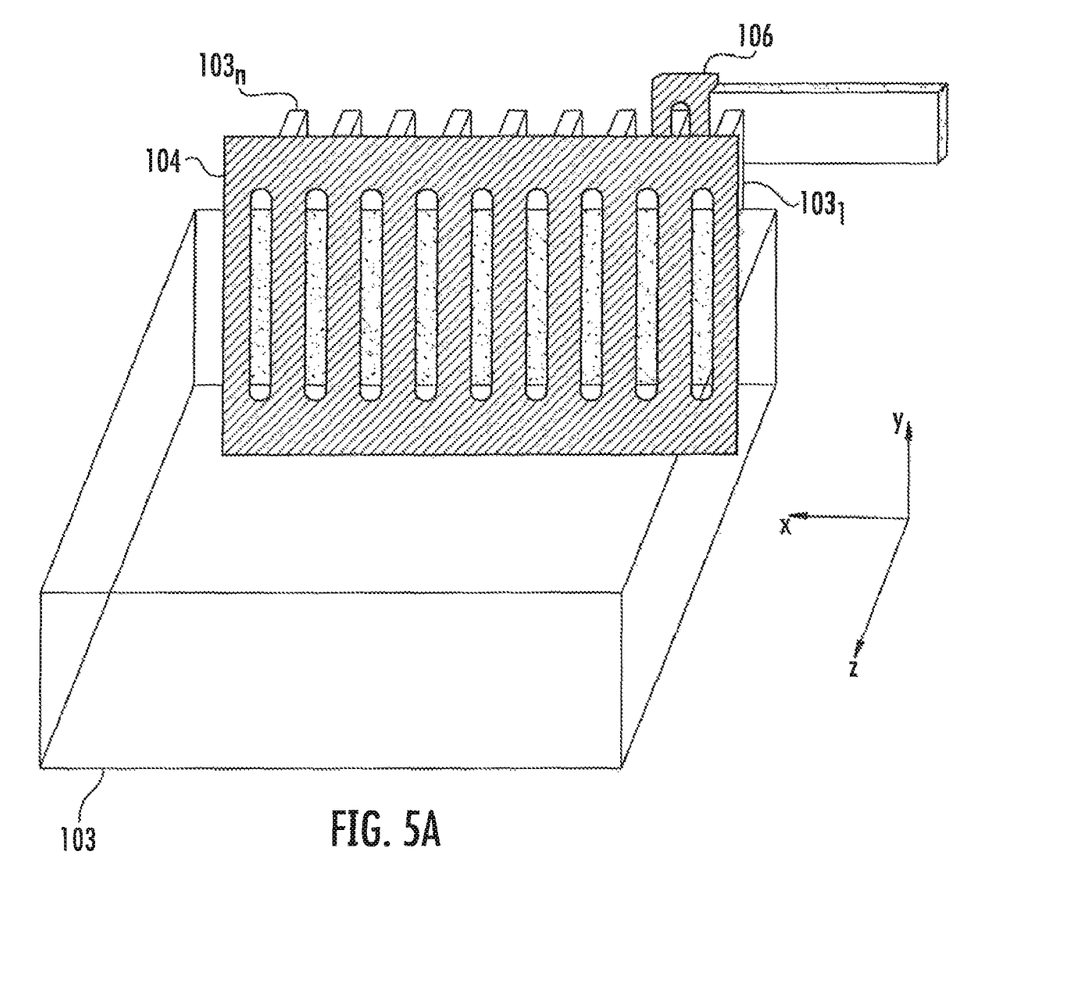
FIG. 5A is a schematic perspective view of implantation through a mask using a Faraday probe in accordance with an embodiment of the present disclosure.

FIG. 5A is a schematic perspective view of ion beam 103 portions of which travel through the apertures of mask 104. As can be seen, the mask 104 is orthogonal to the direction of travel of the ion beam 103 (i.e. Z direction). As the ion beam 103 travels through the apertures of mask 104, portions of the ion beam $103_1 \ldots 103_N$ would form "stripes" of dopant implantation across the surface of the substrate when the substrate is positioned on the platen. The other portions of the ion beam 103 incident are blocked by the area of the mask between the apertures. Faraday probe 106 is positioned behind mask 104 and translates in the X direction across the ion beam portions $103_1 \ldots 103_N$. Faraday probe 106 is illustrated as being positioned toward the top (in the Y direction) of ion beam 103. However, this is for explanatory purposes and the probe 106 may be positioned anywhere along the Y axis of the ion beam 103. However, it is optimal that the Faraday probe 106 be parallel or substantially co-planar with the surface 100a (shown in FIG. 4) in the z direction so that the probe receives substantially the same ion beam portions $103_1 \ldots 103_N$ that would be received by the substrate 100 as if the substrate was receiving implantation of the ion beam 103 as the probe translates across the beam 103 in the X direction. In this manner, the ion current of the portions of the beam that travel through the apertures is measured by the Faraday probe. In addition, the position of the probe 106 is monitored such that variations in ion beam current detected by the probe may be correlated with a particular one or more of the plurality of apertures in mask 104. For example, over time the edges of the apertures of the mask 104 may erode from constant exposure to beam 103. This may cause the width of one or more apertures to enlarge beyond a given implant and alignment tolerance level. By monitoring the position of the probe as it translates across the ion beam portions $103_1 \ldots 103_N$, the ion beam current measured at a particular one of the apertures may be determined to be outside a given tolerance level. Accordingly, the condition of the mask 104 and more particularly the condition of the apertures of the mask may be monitored. It has been found that an increase in the width of an aperture 105 of up to about 20% can be tolerated without compromising the integrity of an implant profile for a solar cell. This is due to the fact that a masked area (i.e. the area of the substrate not disposed behind one of the apertures 105) is typically more heavily doped than the portions of the substrate behind the apertures 105 of an emitter cell which are more lightly doped. As the edges of an aperture 105 erode, the emitter area becomes more heavily doped than designed. This may compromise solar cell performance.

Figure 5B:
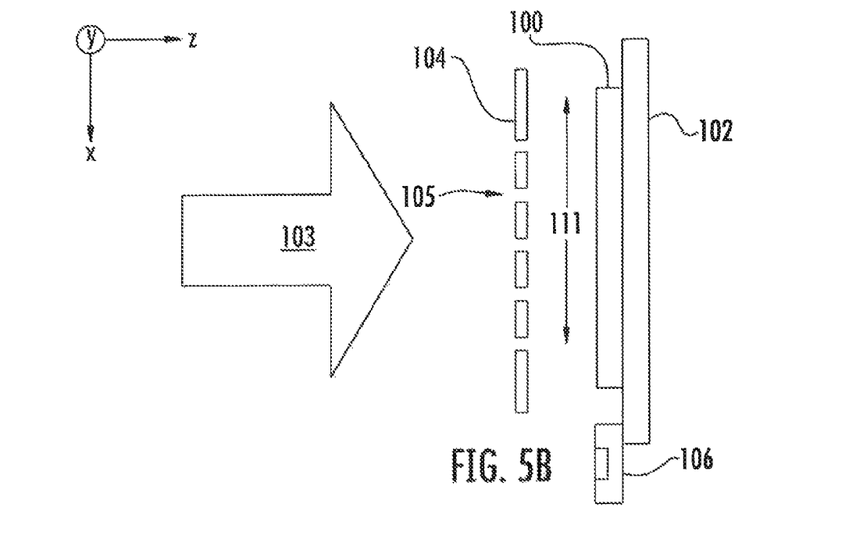
FIG. 5B is a top cross-sectional schematic view of implantation through a mask using a Faraday probe in accordance with an embodiment of the present disclosure.

FIG. 5B is a top cross-sectional view of the ion beam shown in FIG. 5A through mask 104 and the positioning of the Faraday probe 106 with respect to the mask and a substrate 100 as if the substrate was present. As mentioned above, the Faraday probe 106 translates in the X direction behind mask 104 as indicated by the arrow 111. As the Faraday probe 106 translates behind the mask 104, a signal is generated proportional to the exposed current of the ion beam 103. This current and the known position of the Faraday probe 106 monitor the health or condition of mask 104. The Faraday probe 106 can, for example, be used to properly position the mask 104, optimize the spacing in the Z direction between the mask 104 and the substrate 100, monitor the mask 104 for excessive wear or erosion, monitor the mask 104 for fracturing, or monitor the mask 104 for thermal control.

The signal generated by the probe 106, which is proportional to the ion beam current incident on the probe as it translates across the beam in the X direction indicated by arrow 111, also provides alignment information with respect to the ion beam 103 and mask 104. In particular, if the mask 104 is aligned with the beam such that the angles of the ion beam 103 emanating from the apertures 105 of the mask 104 cause the beam portions $103_1 \ldots 103_N$ (shown in FIG. 5A) to fall within the desired implant region, then the probe 106 may detect a desired ion beam current range indicating that the mask 104 is aligned with the divergent angles of beam 103. Because the beam 103 is composed of like-charged molecules, the beam 103 will naturally diverge causing divergent beam angles. If however, the probe 106 measures ion beam current emanating from a particular one or more of the apertures 105 that is not within the desired range, this indicates that the mask 104 and beam 103 are not aligned or at least not optimally aligned to satisfy implant region requirements for an intended substrate 100.

Figure 6:
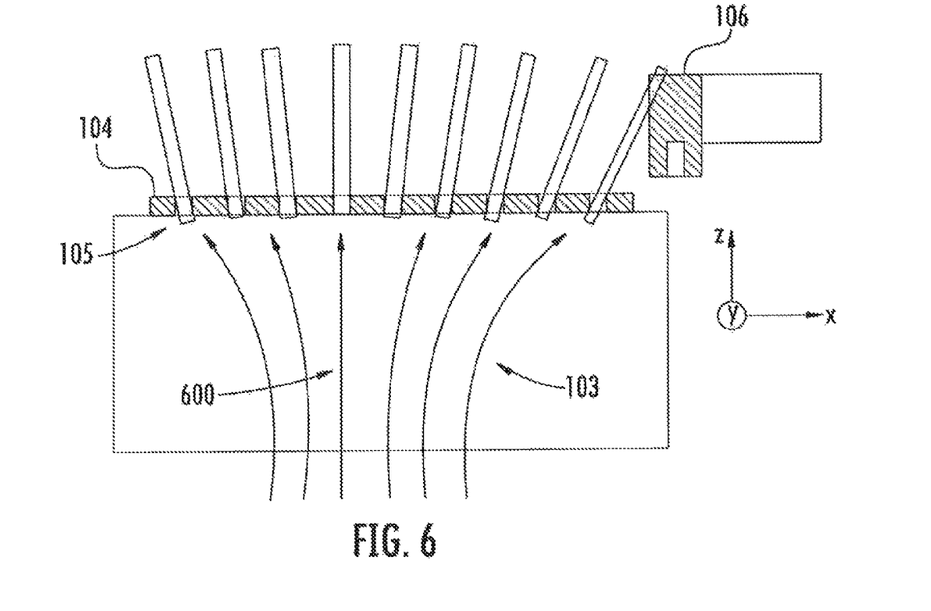
FIG. 6 is a first top cross-sectional view of mask-ion beam angular alignment in accordance with an embodiment of the present disclosure.
Figure 7:
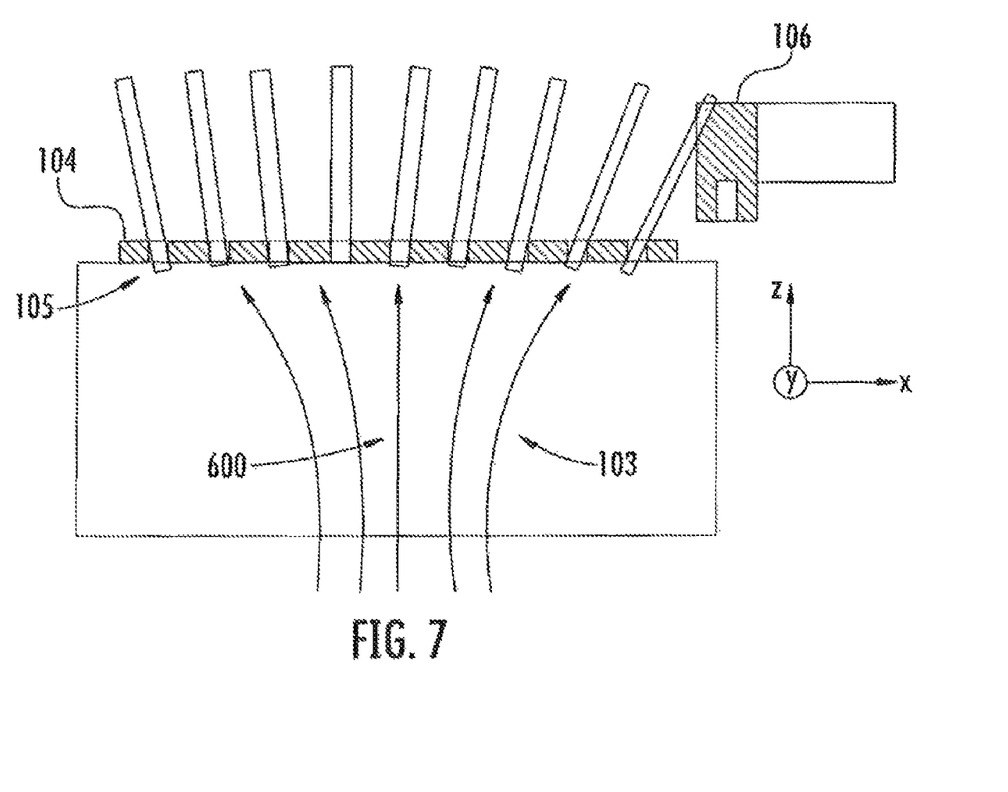
FIG. 7 is a second top cross-sectional view of mask-ion beam angular alignment in accordance with an embodiment of the present disclosure.

FIG. 6 is a first top cross-sectional view of mask-ion beam angular alignment. The Faraday probe 106 may be used for alignment between the mask 104 and the ion beam 103. The mask 104 can be oriented with respect to the ion beam 103 so that the beam angles generated by the apertures 105 will implant the proper regions of an intended substrate 100. Additionally, by aligning the mask 104 with respect to the existing beam divergence angles of the ion beam 103, the mask 104 can optimize the available current of the ion beam 103. The angle of the ion beam 103 that passes through the apertures 105 is fixed, and, thus, the amplitude of the ion beam 103 measured by the Faraday probe 106 is optimal when the angle of the ion beam 103 and angle of the mask 104 are aligned. In other words, since the admittance angles through the apertures 105 of mask 104 are fixed (i.e. the apertures are positioned through particular locations across the mask) the ion beam current measured by the probe 106 as it translates across the beam in the X direction is optimal when the beam divergence angles and mask angles are aligned. Thus, by using the probe 106 to provide feedback of the amount of ion beam current detected through the apertures 104, alignment of the mask 100 with respect to the divergent angles of beam 103 as it travels through the mask can optimize the available ion beam current incident on an intended substrate 100. Consequently, by maximizing the amount of beam current incident on the intended substrate 100, throughput of the implanter may be optimized. The angles of the ion beam 103 in FIGS. 6-7 are exaggerated for clarity.

In FIG. 6, the mask 104 is shown misaligned to the ion beam 103. In this particular instance, the peak beam angles are not centered on the midpoint of the mask 104. Instead, the mean beam angle 600 of the ion beam 103 is off-center with respect to the mask 104. To correct this, the mask 104 may be translated by a certain angle or distance to center the mean beam angle 600 to coincide with the center of the mask 104. In another instance, the beam 103 is adjusted to center the mean beam angle 600 to coincide with the center of the mask 104. FIG. 7 is a second top cross-sectional view of mask-ion beam angular alignment. In this embodiment, the mean beam angle 600 is coincides with the center of the mask 104.

Figure 8:
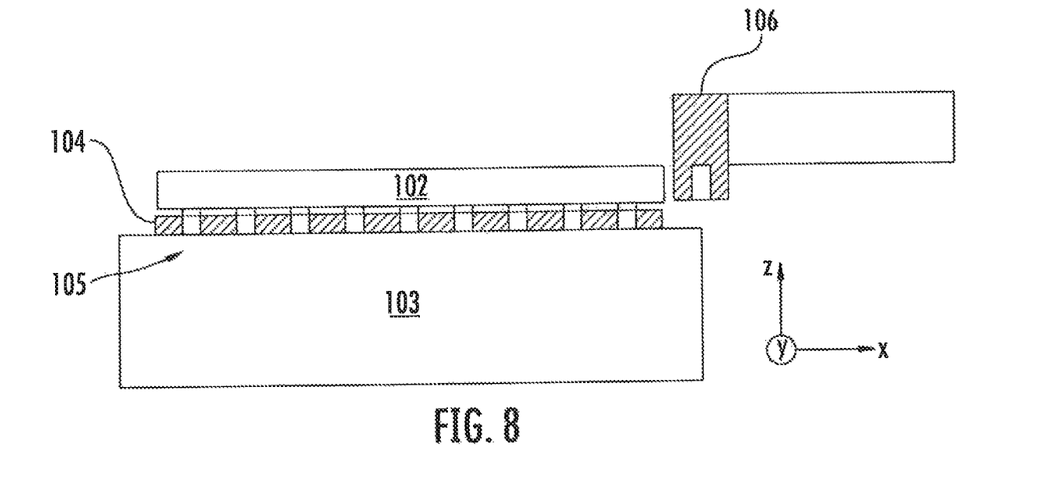
FIG. 8 is a first top cross-sectional view of mask-substrate alignment in accordance with an embodiment of the present disclosure.

FIG. 8 is a first top cross-sectional view of mask-substrate alignment. FIG. 8 illustrates an ideal case where the ion beam 103 is aligned with the mask 104 and the beam passes through the apertures 105 optimally. The resulting implant region matches the size (width in the x direction and length in the y direction) of the apertures 105. However, since the ion beam 103 is composed of like-charged molecules or atoms as noted above, the beam will diverge some small amount.

Figure 9:
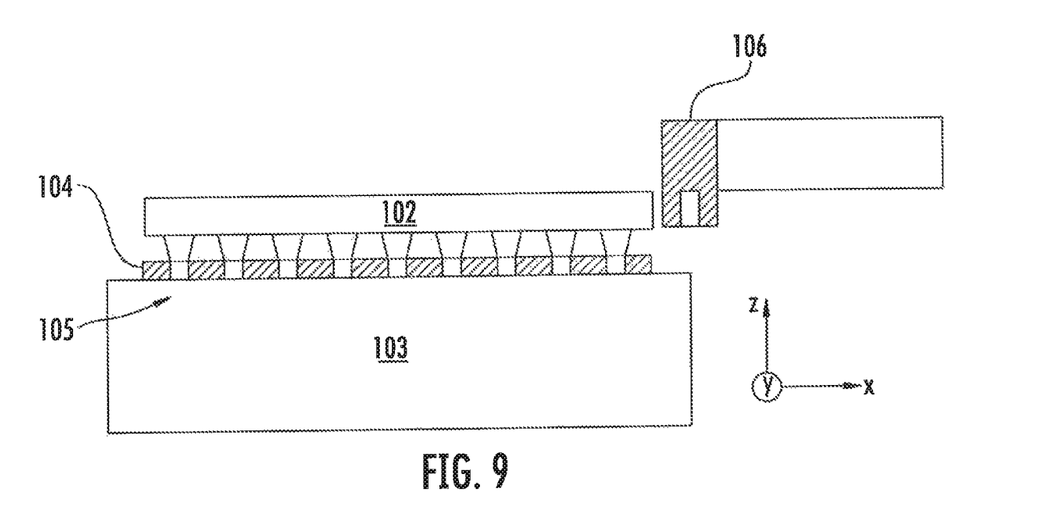
FIG. 9 is a second top cross-sectional view of mask-substrate alignment in accordance with an embodiment of the present disclosure.

FIG. 9 is a second top cross-sectional view of mask-substrate alignment. FIG. 9 illustrates beam divergence. The ion beam 103 that passes through the apertures 105 does not have the same dimensions at the platen 102 as it did leaving the apertures 105. This divergence will vary based on the conditions of the ion beam 103. A small gap between the mask 104 and platen 102 or substrate 100 on the platen 102 may minimize the effects of beam divergence. Minimizing this gap between the mask 104 and platen 102 or substrate 100 on the platen 102 may ensure that the actual implant region will be similar to the desired implant region by minimizing the distance between the mask and the substrate within which the ion beam 103 has available to diverge. However, the gap between the mask 104 and platen 102 or substrate 100 on the platen 102 may vary as a result of machining tolerances, assembly tolerances, systems loads, or other reasons. Given the characteristic of the ion beam to diverge as it travels, it is important to maintain as small a gap as possible in the Z direction between the mask 104 and the substrate 100. If the gap is too large, then the implanted region will exceed the intended target region on the substrate. In addition, the mask 104 may include alternatively configured holes, slots, etc. (as mentioned above) that form a two dimensional pattern on the substrate 100. In this embodiment, the angles in the X and Y direction determine the implant pattern fidelity.

Figure 9A:
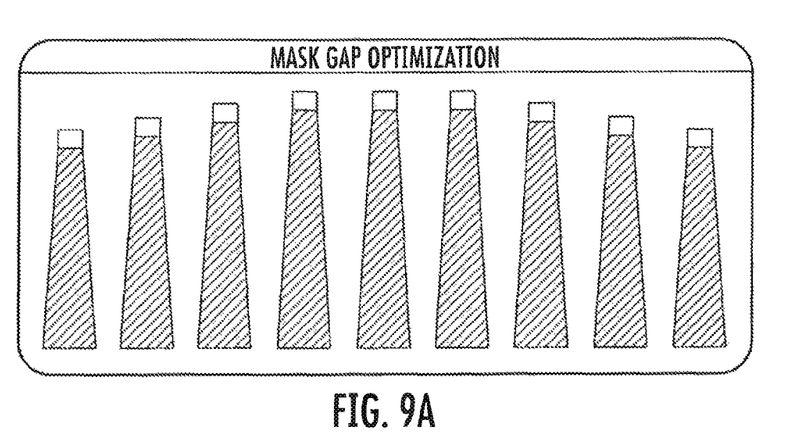
FIG. 9A illustrates a feature profile associated with a large gap between a mask and a substrate or platen.

To optimize the gap between the mask 104 and platen 102 or substrate 100 on the platen 102, the Faraday probe 106 creates a feature profile measurement behind the mask 104. For example, FIG. 9A illustrates a feature profile where a large gap exists between the mask 104 and platen 102 or substrate 100. As can be seen, a larger gap between the mask 104 and platen 102 or substrate 100 on the platen 102 will cause the resulting profile to the Faraday probe 106 to be wider in dimension and shorter in peak amplitude. In one embodiment, the gap between the mask 104 and platen 102 or substrate 100 on the platen 102 can be adjusted by servo motors, and then the Faraday probe 106 can confirm the profiles are within the specification for the substrate 100.

Figure 9B:
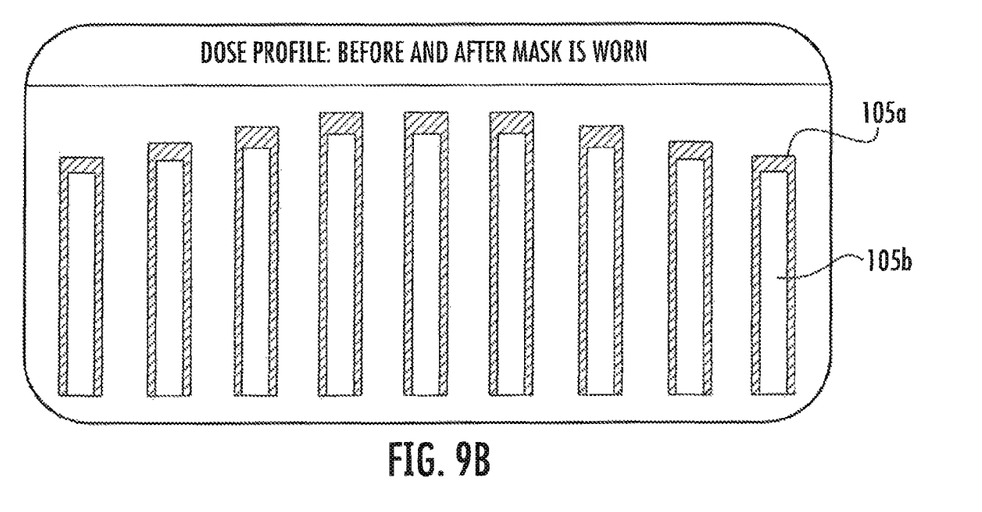
FIG. 9B illustrates a signal profile for a mask having worn apertures overlayed on a signal profile for a mask having non-worn apertures.

Over time, an ion beam 103 will erode the material of the mask 104 and in particular the edges of the apertures 105. This erosion is caused at least in part by surface sputtering and thermal cycling. Eventually the mask 104 will need to be replaced because the apertures 105 have eroded past a specific tolerance or have incorrect dimensions. A Faraday probe 106 can scan behind the mask 104 to monitor for this erosion. In one instance, an eroded mask 104 will exhibit a signal profile that has a high amplitude and large line width. FIG. 9B illustrates a signal profile for a mask having worn apertures 105 (shaded region 105a) overlayed on a signal profile for a mask having non-worn apertures (illustrated by middle portions 105b). In particular, the current signal profile of the shaded regions shows a signal having a higher amplitude and larger line width than the signal associated with a mask having non-worn apertures. Since the height of the ion beam 103 can vary, the erosion of the mask 104 may not be uniform from one side of the aperture 105 to the opposite side of the aperture 105. In one particular embodiment, the Faraday probe 106 is positioned at an angle with respect to the mask 104.

Figure 10:
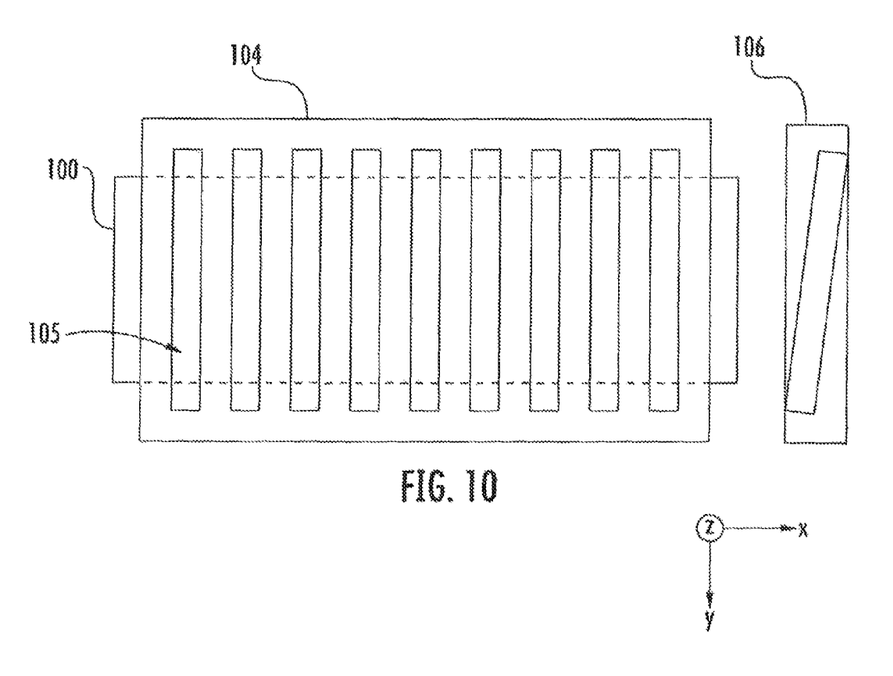
FIG. 10 is a front perspective view of an embodiment of a Faraday probe to test for mask erosion in accordance with an embodiment of the present disclosure.
Figure 11:
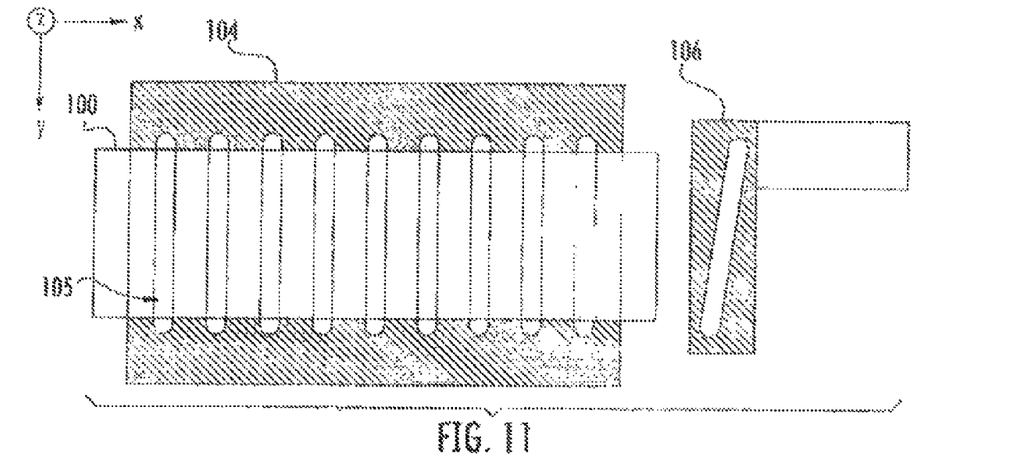
FIGS. 11-13 are front perspective views of the embodiment of a Faraday probe to test for mask erosion of FIG. 10 during translation of the Faraday probe.
Figure 12:
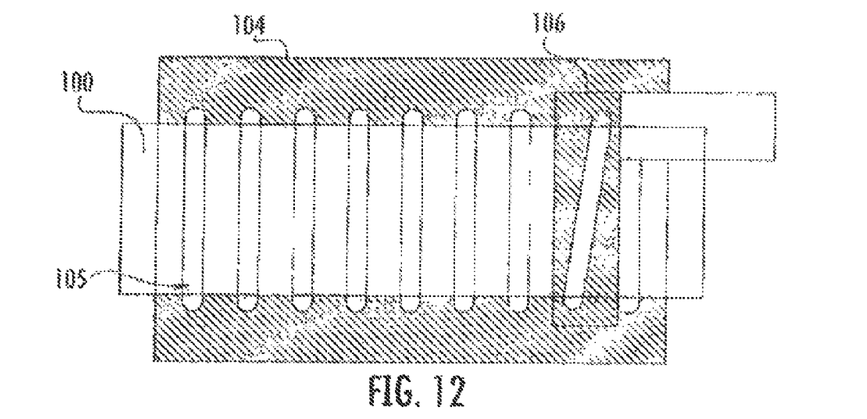
Figure 13:
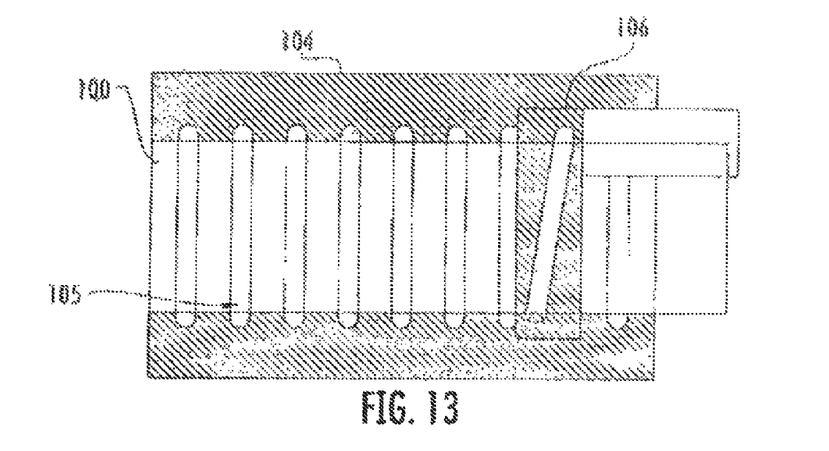

FIG. 10 is a front perspective view of an embodiment of a Faraday probe to test for mask erosion. Because the Faraday probe 106 is at an angle with respect to the mask 104, the Faraday probe 106 is only exposed to a portion of the aperture 105 as it scans. FIGS. 11-13 are front perspective views of the embodiment of a Faraday probe to test for mask erosion of FIG. 10 during translation of the Faraday probe. A profile for the mask 104 will indicate if the dimensions of the apertures 105 are not uniform.

In addition to erosion, the ion beam 103 may induce deposition or coating of the mask 104. In this case, rather than the apertures 105 growing in dimension, the apertures 105 will shrink or narrow in dimension. As with erosion, this shrinking or narrowing of the apertures 105 may vary from one side of the aperture 105 to the other side of the aperture 105 as well as along the length of the aperture. A Faraday probe 106 can scan behind the mask 104 to monitor for coating. In one instance, a coated mask 104 with narrowed or shrunken apertures 105 will exhibit a signal profile that has a low amplitude and small line width as compared to that shown in FIG. 9B.

The mask 104 may be composed of mechanically delicate materials or features. Thus, fracturing of the mask 104 is a concern. This fracturing may be caused by, for example, thermal loads, vibration, or erosion. If the mask 104 fractures, the Faraday probe 106 will detect the missing portion of the probe. The broken or missing portion of the mask 104 will be evident from the signal displaying ion beam 103 current in an unexpected area. Should this happen, in one embodiment, the Faraday probe 106 indicates to the system that a fatal error has occurred and that repair is required. Furthermore, by detecting such a fractured mask improper implantation is prevented.

The mask 104 is exposed to strikes by the ion beam 103 during its lifetime. The amount of power dropped into the mask 104 depends on the parameters of the ion beam 103, such as total voltage or beam current. This power dropped into the mask 104 will create a thermal load on the mask 104. The resulting thermal expansion of the material that the mask 104 is composed of may cause positioning errors of the mask 104 or the apertures 105. Since this material in the mask 104 expands at a rate proportional to the thermal excursion of the mask 104, the Faraday probe 106 can estimate the temperature of the mask 104 to ensure the mask 104 stays within any functional limits. The pitch of the signal will vary with the temperature of the mask 104. Thus, as the apertures 105 changes size or dimensions due to thermal load, the Faraday probe 106 can measure these changes.

While the embodiments above use a Faraday probe 106, other measurement systems, such as an optical digital imaging system, may be used alone or in conjunction with the Faraday probe 106. In this particular embodiment, the substrate 100 is examined after implantation. The resulting image is captured and processed. The implanted regions on the substrate 100 will demonstrate the same signal variation as described above for each of the conditions or tests performed by the Faraday probe 106. In another embodiment the mask 104 may be examined by optical imaging and the resulting image captured and processed. The features on the mask 104 should demonstrate the same signal variation as described above for each of the conditions or tests performed by the Faraday probe 106. Periodic inspection of the mask 104 should match the results of the Faraday probe 106.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for aligning a mask in an ion implanter comprising:
    directing an ion beam through a plurality of apertures of a mask toward a platen configured to support a target substrate;
    disposing an ion current measurement device, behind said mask, in a substantially co-planar relationship with respect to said target substrate as if said substrate is positioned on said platen;
    translating the ion current measurement device across said ion beam;
    recording the position of the ion current measurement device as it translates across said ion beam;
    measuring a current of the ion beam directed through the plurality of apertures of the mask using the ion current measurement device at the recorded positions;
    generating a current signal in response to the measured ion beam current from the ion current measurement device at each of the recorded positions;
    transmitting the current signal to a controller; and
    generating a control signal by said controller used to position at least one of the ion beam or the mask based on the control signal such that a mean ion beam angle is centered with respect to a center one of the plurality of apertures of the mask.

2. The method of claim 1 wherein controlling the position of the mask further comprises:
    sending a signal to a mask translation mechanism; and
    displacing the mask with respect to the target substrate based on said signal received by the mask translation mechanism.

3. The method of claim 2 wherein displacing the mask with respect to the target substrate includes variably positioning the mask in linear relationship a distance away from said platen.

4. The method of claim 2 wherein displacing the mask with respect to the platen includes variably positioning the mask in an angular relationship with respect to said platen.

5. The method of claim 1 wherein translating the ion current measurement device further comprises translating the ion current measurement device using a translation mechanism connected thereto, said translation mechanism including a servo motor to move said ion current measurement device across said ion beam.

6. The method of claim 1 wherein measuring a current of the ion beam directed through the plurality of apertures of the mask using the ion current measurement device at the recorded positions further comprises measuring the current as it flows from the ion current measurement device to ground.

7. The method of claim 1 wherein the ion current measurement device is a Faraday probe.

8. The method of claim 1 wherein the ion current measurement device comprises a plurality of Faraday probes configured to provide a plurality of ion current measurements associated with said portion of the ion beam directed through each of said plurality of apertures of the mask.

9. An ion implanter system comprising:
    an ion source;
    a beam line assembly configured to extract ions from said ion source to form an ion beam and direct the ion beam toward a platen;
    a mask disposed in front of said platen, said mask having a plurality of apertures to allow respective portions of said ion beam through said mask toward said platen;
    an ion current measurement device disposed substantially co-planarly with a surface of said target substrate as if said target substrate was positioned on said platen, said ion current measurement device configured to translate across said ion beam and generate signals proportional to the ion current received through said apertures as said measurement device translates across said ion beam; and
    a controller configured to receive said signals from said ion current measurement device and determine an orientation of said mask such that angles of the ion beam through one or more of said plurality of apertures in said mask are aligned with a target substrate.

10. The ion implanter system of claim 9 wherein said controller is configured to compare the position of said mask with said received signals, said ion implanter system further comprising a translation mechanism connected to said mask and communicatively coupled to said controller, said translation mechanism configured to correct positioning of said mask in response to said signals from said ion current measurement device.

11. A method for determining the condition of a mask used in an ion implanter comprising:
    directing an ion beam through a plurality of apertures of a mask toward platen configured to support a target substrate, said mask being positioned orthogonally with respect to said ion beam, each of said apertures having a respective length and a width;
    disposing an ion current measurement device, behind said mask, co-planarly with respect to said target substrate as if said target substrate was positioned on the platen and orthogonal with respect to the ion beam;
    translating the ion current measurement device at an angle with respect to said apertures of said mask across said ion beam;
    detecting an ion beam current incident on said ion current measurement device as it translates across said ion beam such that the ion beam current detected is associated with a portion of the length of each of said apertures;
    recording the position and angle of the ion current measurement device as it translates across said ion beam;
    measuring a current of the ion beam directed through the plurality of apertures of the mask using the ion current measurement device at the recorded positions;
    generating a current signal in response to the measured ion beam current from the ion current measurement device at each of the recorded positions and angles;
    creating a current profile for each of the apertures based on the generated current signal as the ion current measurement device translates across the ion beam; and determining a width of each of the apertures corresponding to the portion of the length of each of said apertures.

12. The method of claim 11 further comprising changing the angle of the ion current measurement device with respect to said apertures of said mask.

13. A method of measuring angles of incidence of an ion beam in an ion implanter comprising:
- positioning an ion beam detector assembly having a plurality of current sensors in a substantially coplanar relationship with a target substrate when said target substrate is positioned on a platen;
- providing an ion beam incident on the detector assembly;
- detecting the beam current associated with each of the plurality of current sensors;
- calculating the angle of incidence on each of the plurality of current sensors using the detected beam currents;
- analyzing the angles of incidence to determine the uniformity of the ion beam; and
- adjusting the beam current based on the calculated incidence angles.

14. An ion implanter system comprising:
- an ion source;
- a beam line assembly configured to extract ions from said ion source to form an ion beam and direct the ion beam toward a platen used to support a target substrate;
- a mask disposed in front of platen, said mask having a plurality of apertures to allow respective portions of said ion beam through said mask toward said platen;
- an ion current measurement device disposed substantially co-planarly with said target substrate as if said target substrate was positioned on said platen, said ion current measurement device configured to translate across said ion beam and generate signals proportional to the ion current received through said apertures as said measurement device translates across said ion beam; and
- a controller configured to receive said signals from said ion current measurement device and determine an orientation of said mask such that angles of the ion beam through one or more of said plurality of apertures in said mask are aligned with the target substrate as if the target substrate was positioned on said platen.

* * * * *